(12) United States Patent
Li et al.

(10) Patent No.: US 11,416,744 B2
(45) Date of Patent: Aug. 16, 2022

(54) MAX POOLING PROCESSOR BASED ON 1T1R MEMORY

(71) Applicant: HUAZHONG UNIVERSITY OF SCIENCE AND TECHNOLOGY, Hubei (CN)

(72) Inventors: Yi Li, Hubei (CN); Rui Kuang, Hubei (CN); Xiang-Shui Miao, Hubei (CN)

(73) Assignee: Huazhong University of Science and Technology, Hubei (CN)

( * ) Notice: Subject to any disclaimer, the term of this patent is extended or adjusted under 35 U.S.C. 154(b) by 442 days.

(21) Appl. No.: 16/631,840

(22) PCT Filed: Jul. 12, 2019

(86) PCT No.: PCT/CN2019/095685
§ 371 (c)(1),
(2) Date: Jan. 17, 2020

(87) PCT Pub. No.: WO2020/093726
PCT Pub. Date: May 14, 2020

(65) Prior Publication Data
US 2021/0224643 A1 Jul. 22, 2021

(30) Foreign Application Priority Data
Nov. 6, 2018 (CN) .......................... 201811314294.X

(51) Int. Cl.
*G11C 11/54* (2006.01)
*G06N 3/08* (2006.01)
(Continued)

(52) U.S. Cl.
CPC ................. *G06N 3/08* (2013.01); *G06N 3/04* (2013.01); *G11C 11/54* (2013.01); *G11C 13/003* (2013.01); *G11C 2213/79* (2013.01)

(58) Field of Classification Search
CPC ..... G11C 11/54; G11C 13/003; G11C 13/004; G11C 13/0021; G11C 2213/79;
(Continued)

(56) References Cited

FOREIGN PATENT DOCUMENTS

| CN | 106530210 | 3/2017 |
|---|---|---|
| CN | 106846239 | 6/2017 |

(Continued)

OTHER PUBLICATIONS

"International Search Report (Form PCT/ISA/210) of PCT/CN2019/095685," dated Sep. 26, 2019, pp. 1-5.

*Primary Examiner* — Sultana Begum
(74) *Attorney, Agent, or Firm* — JCIPRNET

(57) ABSTRACT

The present disclosure belongs to the technical field of artificial neural networks, and provides to a max pooling processor based on 1T1R memory, comprising an input module, a max pooling operation module, and an output module; the input module is configured to transmit an operating voltage according to the convolution result in the convolutional neural network; the 1T1R memory in the max pooling operation module is configured to adjust a conductance value of the RRAM according to the gate voltage of the transistor therein to achieve the max pooling operation by using the non-volatile multi-value conductance regulation characteristic of the RRAM, and store a max pooling result; and the output module is configured to read the max pooling result and output it.

7 Claims, 3 Drawing Sheets

(51) Int. Cl.
*G06N 3/04* (2006.01)
*G11C 13/00* (2006.01)

(58) Field of Classification Search
CPC .... G11C 2213/15; G06N 3/0454; G06N 3/08; G06N 3/04; G06N 3/0635; G06N 3/063
See application file for complete search history.

(56) References Cited

FOREIGN PATENT DOCUMENTS

| | | |
|---|---|---|
| CN | 106971372 | 7/2017 |
| CN | 109635941 | 4/2019 |
| EP | 3343467 | 7/2018 |

MAX POOLING PROCESSOR BASED ON 1T1R MEMORY

CROSS-REFERENCE TO RELATED APPLICATION

This application is a 371 of international application of PCT application serial no. PCT/CN2019/095685, filed on Jul. 12, 2019, which claims the priority benefit of China application no. 201811314294.X, filed on Nov. 6, 2018. The entirety of each of the above-mentioned patent applications is hereby incorporated by reference herein and made a part of this specification.

FIELD OF THE INVENTION

The disclosure belongs to the technical field of artificial neural networks, and more particularly, relates to a max pooling processor based on 1T1R memory.

DESCRIPTION OF RELATED ART

Neural networks and deep learning have developed rapidly in the field of artificial intelligence in recent years, and have achieved many successful applications. Convolutional neural network (CNN) is a widely used deep learning algorithm model, which is widely used in image recognition, pattern recognition and other tasks. The convolutional neural network mainly consists of convolutional layers, pooling layers and fully connected layers. By introducing convolution kernel, the number of synaptic weights is greatly reduced, thereby reducing the network size and the amount of storage and computation. Pooling layers (also called downsampling layers) are usually introduced between the convolutional layers to reduce the spatial size of an image, thereby further reducing the number of parameters and increasing the robustness of the network. Commonly used pooling operations are divided into average pooling and max pooling. At present, the max pooling operation is more commonly used.

Calculation of the convolutional neural network is mostly consumed by convolution operations and pooling operations, and is currently mostly performed by processors such as CPU and GPU. New neural network processors have also been developed to address such calculation. However, these processors all have the problem that a large amount of data transmission between the processor and the memory leads to large power consumption and time consumption, that is, the Von Neumann bottleneck. Especially in the convolutional neural network, there are a large number of intermediate calculation data in the convolutional layers and pooling layers that need to be stored and re-read.

Resistive Random Access Memory (RRAM) has the characteristics of nonvolatility, easy integration, low power consumption, and multi-bit storage, and thus becomes a very promising development target for the next-generation semiconductor memory, which also represents an important development direction of current neural network circuits. However, there are problems such as leakage current and difficulty in controlling in the array operations of the RRAM, and thus, a structure of connecting a transistor to a RRAM in series (1T1R) is used, so that the conductance of the RRAM can be regulated by adjusting the limiting current by the transistor.

BRIEF SUMMARY OF THE INVENTION

In view of the above-described defects or improvement requirements in the art, the present disclosure provides a max pooling processor based on 1T1R memory device, in which one transistor is connected in series with one RRAM to form a 1T1R memory. By combining the specific application background of the pooling operation in the convolutional neural network, the max pooling processor utilizes the non-volatile multi-valued conductance regulation characteristic of RRAM to achieve the max pooling operation. In addition, the max pooling processor can directly store the max pooling results, and effectively cooperate with other structures of the convolutional neural network (such as convolutional layers), thereby effectively solving the problems in the existing convolutional neural networks that a large amount of data needs to be stored and there are a large amount of data transmission between the data storage and data computation. The present disclosure uses 1T1R memories to form a max pooling operation module, which cooperates with an input module and an output module to form a max pooling processor. The input module is configured to receive a convolution operation result in a timing sequence and input it to the max pooling operation module. The max pooling operation module can effectively implement the max pooling operation, and directly store the pooling result, which are then read by the output module for the operation in the next layer, thereby greatly saving the resources. The max pooling operation module is configured to receive the voltage signal of the input module, control the current flowing through the RRAM by the gate voltage of the transistor of the 1T1R memory to regulate the conductance value of the RRAM, thereby completing the pooling operation, and store the pooling result according to the conductance value of the RRAM.

In order to achieve the above objective, according to the present disclosure, there is provided a max pooling processor based on 1T1R memory, wherein the max pooling processor is configured to perform a max pooling operation on a convolution result in a convolutional neural network by using the 1T1R memory formed by a transistor and a RRAM connected in series, and comprises an input module, a max pooling operation module, and an output module, wherein the max pooling operation module is provided with the 1T1R memory.

The input module is connected to the max pooling operation module, and is configured to transmit an operating voltage to the max pooling operation module according to the convolution result in the convolutional neural network, the operating voltage being used as a gate voltage of the transistor in the 1T1R memory.

The 1T1R memory in the max pooling operation module is configured to adjust a conductance value of the RRAM according to the gate voltage of the transistor therein to achieve the max pooling operation by using the non-volatile multi-value conductance regulation characteristic of the RRAM, and store a max pooling result.

The output module is connected to the max pooling operation module, and is configured to read the max pooling result stored in the max pooling operation module and output it.

Preferably, the amplitude of the operating voltage transmitted by the input module is be proportional to the magnitude of the convolution result, and the highest amplitude of the operating voltage does not exceed the range of working voltage of the gate of the transistor.

Further preferably, the operating voltage is transmitted in a form of a voltage pulse, and the voltage pulse corresponds to a plurality of convolution results, wherein voltage amplitudes in different periods in the voltage pulse correspond to different convolution results.

Further preferably, the transistor in the 1T1R memory is a NMOS transistor, and in a case where two ends of the RRAM are respectively a bottom electrode and a top electrode, a drain of the transistor is connected to the bottom electrode of the RRAM.

When the max pooling processor based on 1T1R memory performs the max pooling operation, for the 1T1R memory, in addition to the gate voltage of the transistor being the operating voltage transmitted by the input module, a source of the transistor is grounded, and a constant preset voltage $V_s$ is applied to the top electrode of the RRAM.

When the max pooling processor based on 1T1R memory performs a reading operation, for the 1T1R memory, a constant preset voltage $V_d$ is applied to the gate voltage of the transistor, a constant preset voltage $V_r$ is applied to the top electrode of the RRAM, and the source of the transistor is configured to output a current carrying conductance value information of the RRAM to the output module, so that the max pooling result stored in the 1T1R memory is obtained according to the current.

Further preferably, the output module is configured to convert the current carrying conductance value information of the RRAM into a voltage signal in proportion and output it, thereby obtaining the max pooling result stored in the 1T1R memory.

Further preferably, there are a plurality of 1T1R memories, and these 1T1R memories are arranged in the max pooling operation module in a form of a two-dimensional 1T1R array.

Among these 1T1R memories, in 1T1R memories in the same row, sources of transistors are connected to each other through a wire, and connected to a third peripheral control circuit; gates of the transistors are connected to each other through a wire, and connected to a first peripheral control circuit.

In 1T1R memories in the same column, top electrodes of RRAMs are connected to each other by a wire, and connected to a second peripheral control circuit.

When the max pooling processor performs the max pooling operation in batches by taking the 1T1R memories in the same column as a unit, the first peripheral control circuit is configured to input the operating voltage transmitted by the input module to the unit, the second peripheral control circuit is configured to input a constant preset voltage $V_s$ to the unit, and the third peripheral control circuit is configured to input a voltage of 0 to the unit, other 1T1R memories being disconnected with the first peripheral control circuit, the second peripheral control circuit and the third peripheral control circuit.

When the max pooling processor performs a reading operation in batches by taking the 1T1R memories in the same column as a unit, the first peripheral control circuit is configured to input a constant preset voltage $V_d$ to the unit, the second peripheral control circuit is configured to input a constant preset voltage $V_r$ to the unit, and the third peripheral control circuit is configured to output source currents of the respective 1T1R memories in the unit to the input module, other 1T1R memories being disconnected with the first peripheral control circuit, the second peripheral control circuit and the third peripheral control circuit.

Further preferably, each row in the two-dimensional 1T1R array corresponds to one pooling layer, and each pooling layer feature map data is stored in each row in the two-dimensional 1T1R array.

Further preferably, an absolute value of the voltage $V_r$ is 0.2 V or less, and an absolute value of the voltage $V_d$ is 1.8 V or more.

Through the above technical solution conceived by the present disclosure, compared with the prior art, the max pooling processor based on 1T1R memory can achieve the function of max pooling in the convolutional neural network, and effectively cooperate with other structures of the convolutional neural network (such as convolutional layers), thereby effectively solving the problems in the existing convolutional neural networks that a large amount of data needs to be stored and there are a large amount of data transmission between the data storage and data computation. The 1T1R memory used in the present disclosure can adjust a conductance value of the RRAM according to the gate voltage of the transistor therein to achieve the max pooling operation by using the non-volatile multi-value conductance regulation characteristic of the RRAM, and store a max pooling result. The 1T1R memories constitute the max pooling operation module, which cooperate with an input module and an output module. The input module converts the result of the convolution operation in the convolutional neural network into a voltage signal required by the max pooling operation module and inputs it to the max pooling operation module; the max pooling operation module receives the input voltage signal to perform the max pooling operation, and store the pooling result; and the output module can read the stored pooling result and output it for subsequent operations (such as subsequent calculations in the convolutional neural network). The processor of the present disclosure can directly perform a pooling operation on the convolution result in the convolutional neural network and directly store the pooled result, which greatly saves storage consumption. The integration of pooling calculation and storage eliminates the consumption of data interaction, thereby greatly shortening the calculation time and reducing the energy consumption.

The input module converts an input value of the external convolution result into an input voltage signal required by the max pooling operation module. Taking as an example the input voltage signal input by the input module whose amplitude is proportional to the magnitude of the convolution result, the input module receives the results of respective convolution operations, converts them into voltage signals, and input them to the max pooling operation module one by one. Within the gate operating voltage range of the 1T1R memory, the result of each convolution operation is different in magnitude. The magnitude of the convolution result is proportional to the pulse amplitude of the input voltage signal, that is, the larger the convolution result, the larger the pulse amplitude of the corresponding input voltage signal.

In the present disclosure, the RRAM can be operated to a different conductance state by applying an operating voltage to the gate of the transistor by the input module. Within the working range of the operating voltage, the higher the operating voltage, the greater the limiting current flowing through the RRAM, and conversely, the smaller the limiting current. The RRAM can be operated to different conductance states by the different limiting currents. But for the same RRAM, when a new operating voltage is lower than the historical maximum operating voltage, that is, the limiting current is lower than the historical maximum limiting current, the conductance value of the RRAM is not changed, and thus the RRAM may record the conductance value at the maximum operating voltage, which corresponds to the maximum convolution operation result, thereby completing the max pooling operation. Each RRAM device may record the max pooling operation result once, and the max pooling operation module can include multiple 1T1R memories as a whole. These 1T1R memories may form a 1T1R memory array, that is, the pooling layer data can be stored in a form of an RRAM array. In addition, three peripheral control circuits are provided to select a RRAM to be operated, and apply a corresponding voltage signal to the RRAM.

The output module is configured to read the conductance value of the 1T1R array. An equivalent read voltage ($V_r$ is generally 0.2 V or less) is applied to each RRAM through a peripheral control circuit, and the read voltage is less than the operating voltage and does not change the conductance value. A corresponding output current value corresponding to the pooling layer data is collected, and the output module receives the output current value and converts it into a voltage signal in proportion for subsequent operations. In addition, since the read voltage does not affect the conductance value, the magnitude of the obtained current value is proportional to the conductance value, and thus the pooling operation result stored in the array can be read. The output module receives the output current signal obtained by applying the read voltage, converts it into a voltage signal in proportion, and output it for subsequent operations. The accuracy of detecting the current can be set according to the actual model of the RRAM. For example, the accuracy can be $10^{-6}$ A.

In the present disclosure, the peripheral circuits control voltages to be applied to the 1T1R array. A RRAM to be operated can be selected by changing the states of different terminals (e.g., being applied with a voltage, disconnected or grounded). The conductance value of the RRAM can be changed by applying the operating voltage, and the conductance value of the RRAM can be read by applying the read voltage. For example, when the pooling operation is performed, respective pooling layers can be operated in parallel. Each row in the array may correspond to a pooling layer, and since only one 1T1R memory in one row can be operated at a time (when parallel operations are performed, 1T1R memories in one column can be operated in batches), the operating unit can be selected by applying the operating voltage to the drain of 1T1R memory that needs to be operated, with drains of other 1T1R memories disconnected. After operating each 1T1R memory in each row, each pooling layer feature map data is stored in each row unit. When a read operation is performed, all read voltages applied to the 1T1R memories are the same, and can be applied in parallel (at this time, it may be preferable to perform batch reading processing on the 1T1R memories in the same column), and all stored results can be obtained after traversing.

In summary, the present disclosure utilizes a 1T1R memory in which the conductance value of the RRAM can be adjusted by regulating the gate voltage of the transistor to achieve the max pooling operation (that is, by using the non-volatile multi-value conductance regulation characteristic of the RRAM), and the max pooling result is stored. The processor of the present disclosure can directly perform a pooling operation on the convolution result in the convolutional neural network and directly store the pooled result, which greatly saves storage consumption. In addition, the integration of pooling calculation and storage is achieved, which eliminates the consumption of data interaction, thereby greatly shortening the calculation time and reducing the energy consumption.

DETAILED DESCRIPTION OF THE EMBODIMENTS

For clear understanding of the objectives, features and advantages of the present disclosure, detailed description of the present disclosure will be given below in conjunction with accompanying drawings and specific embodiments. It should be noted that the embodiments described herein are only meant to explain the present disclosure, and not to limit the scope of the present disclosure. Furthermore, the technical features related to the embodiments of the disclosure described below can be mutually combined if they are not found to be mutually exclusive.

Embodiment 1

Figure 5:
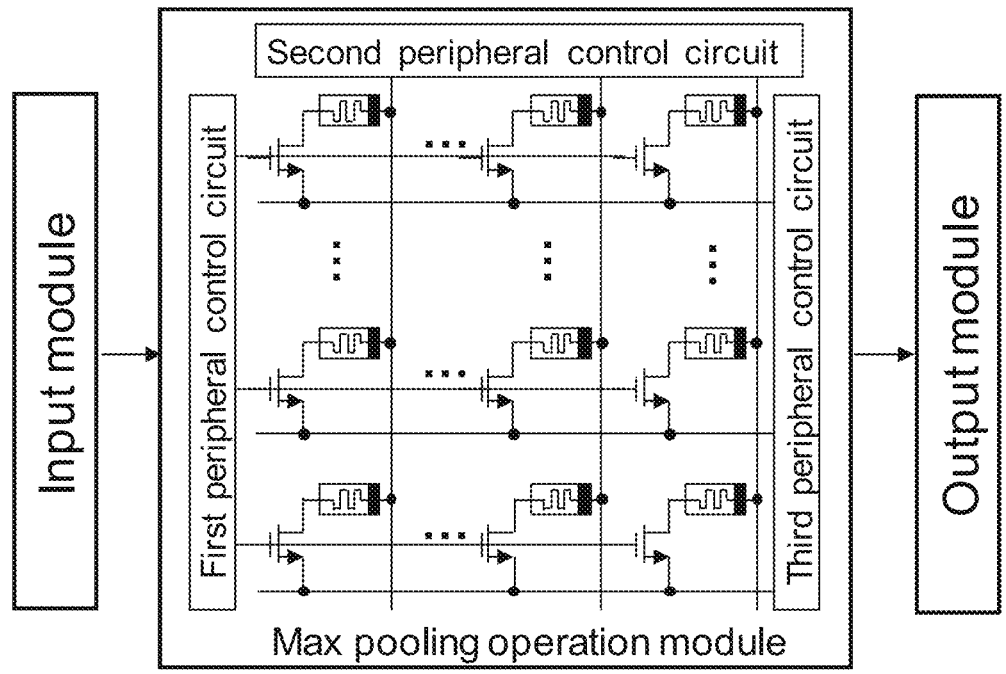
FIG. 5 is a schematic diagram of an overall structure of a processor according to the preferred embodiment of the present disclosure.

FIG. 5 is a schematic diagram of an overall structure of a max pooling processor based on 1T1R memory according to a preferred embodiment of the present disclosure.

As shown in FIG. 5, the processor includes: an input module, a max pooling operation module, and an output module. The input module is configured to receive a convolution operation result and input it to the max pooling operation module. The max pooling operation module is implemented by a 1T1R array, which can effectively perform a max pooling operation and directly stores a pooling result. The output module is configured to read the pooling result for the operation of the next layer.

Figure 1:
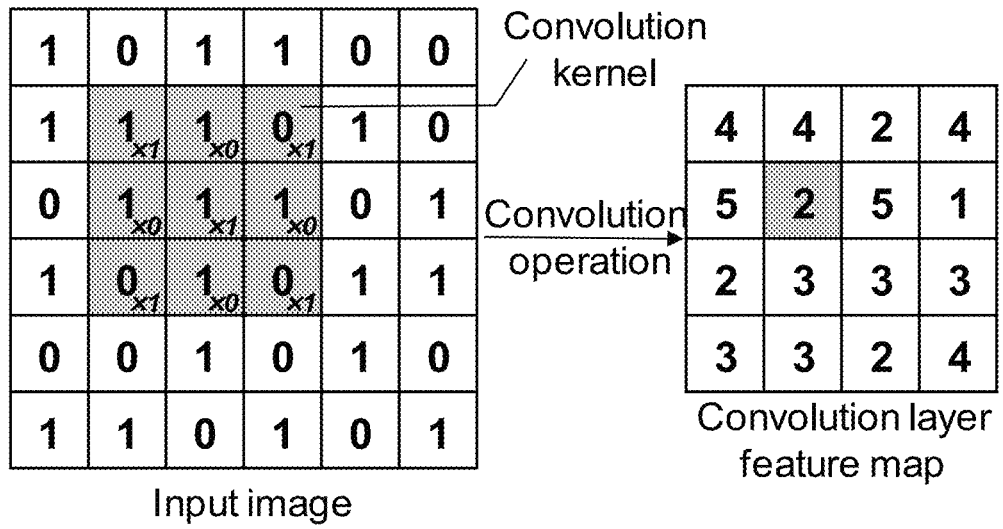
FIG. 1 is a schematic diagram showing a convolution operation of a convolutional neural network.
Figure 2:
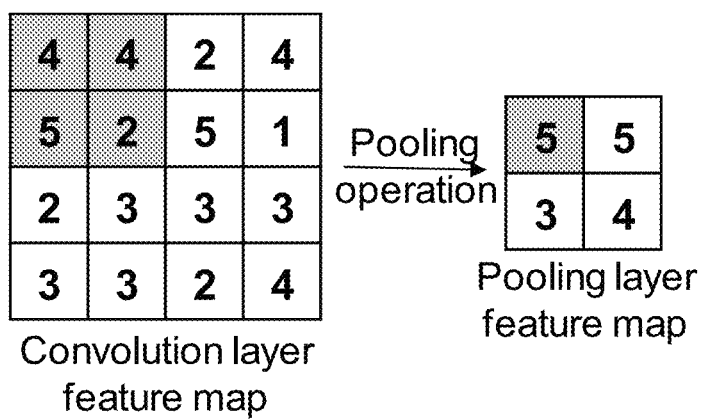
FIG. 2 is a schematic diagram showing a max pooling operation of the convolutional neural network.

The most typical part of the convolutional neural network includes a convolution operation and a pooling operation. The convolution operation refers to scanning an input layer with a convolution kernel, in which the convolution kernel is a small matrix containing different weight values, and the input layer is usually a pixel matrix of an input image. In each scan, a convolution operation of multiplication and addition is performed, in which the input layer is usually scanned with the convolution kernel from left to right and top to bottom in sequence, and an output value is recorded each time the convolution kernel moves by one unit, thereby obtaining a convolution layer feature map. FIG. 1 shows a convolution operation in which a 6×6 input matrix is convolved with a 3×3 convolution kernel matrix to obtain a 4×4 convolution layer feature map. The most commonly used pooling operation is the max pooling operation, in which the convolution layer feature map is scanned with a scanning frame without overlap in a scanning order similar to that of the convolution operation, and a maximum value in the convolution layer feature map within the scan frame is output in each scan. FIG. 2 shows a max pooling operation in which the 4×4 convolution layer feature map obtained by the convolution operation is scanned with a 2×2 scanning frame to obtain a 2×2 pooling layer feature map.

Figure 3:
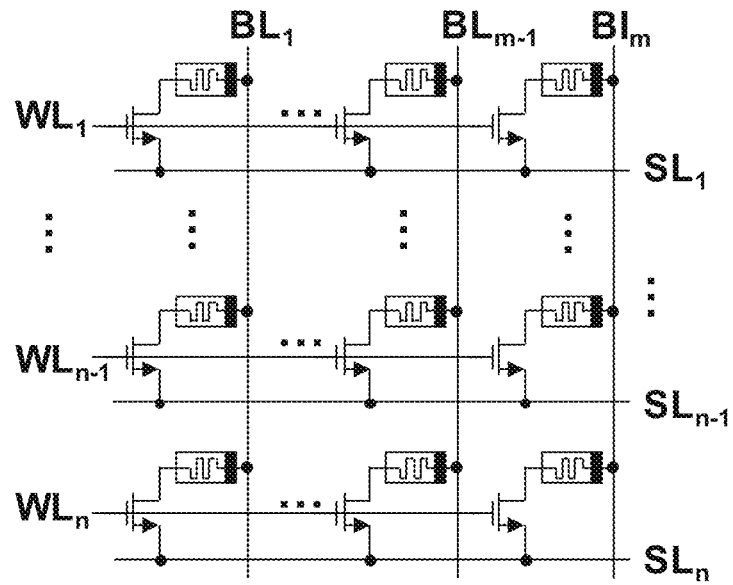
FIG. 3 is a schematic structural diagram of a 1T1R array according to a preferred embodiment of the present disclosure.

FIG. 3 is a schematic structural diagram of a 1T1R array according to a preferred embodiment of the present disclosure. RRAM's read and write speed, size, and power consumption have huge advantages over traditional memories, and its non-volatile multi-valued conductance state enables multi-valued storage. Usually, different voltage biases can be applied to two ends of the RRAM, so that the RRAM is changed to different conductance states, or a certain voltage bias can be applied to the two ends of the RRAM, and then the limiting current of the RRAM can be changed to enable different conductance states. However, in ordinary RRAM arrays, due to problems such as line resistance and crosstalk, it is often difficult to precisely regulate a single device. Therefore, a 1T1R structure of connecting one transistor to one RRAM in series can be used, in which a drain of the transistor is connected to the RRAM in series, the RRAM to be regulated can be selected by applying respective voltages to a source and a drain of the transistor, and the gate voltage is controlled to regulate the limiting current, and then control the conductance value of the RRAM.

As shown in FIG. 3, when the selected RRAM is regulated, a control voltage $V_s$ is applied to its BL terminal, its SL terminal is grounded, and different operating voltages $V_g$ are applied to its WL terminal. Within the working range of the operating voltage, the higher the operating voltage, the larger the limiting current flowing through the RRAM. The RRAM can be operated to different conductance states by different limiting currents. But for the same RRAM, when a new operating voltage is lower than the historical maximum operating voltage, that is, the limiting current is lower than the historical maximum limiting current, the conductance value of the RRAM is not changed, and when a new operating voltage is larger than the historical maximum operating voltage, the RRAM is operated to a higher conductance state. In this way, the RRAM may record the conductance state at the maximum input voltage, which responds to the maximum convolution operation result, thereby completing the max pooling operation.

As shown in FIG. 3, one pooling layer feature map data can be stored in RRAMs in one row, that is, one pooling layer feature map contains at most m data, and each row corresponds to one pooling layer feature map. Since the 1T1R array has n lines, n feature maps can be stored.

Figure 4:
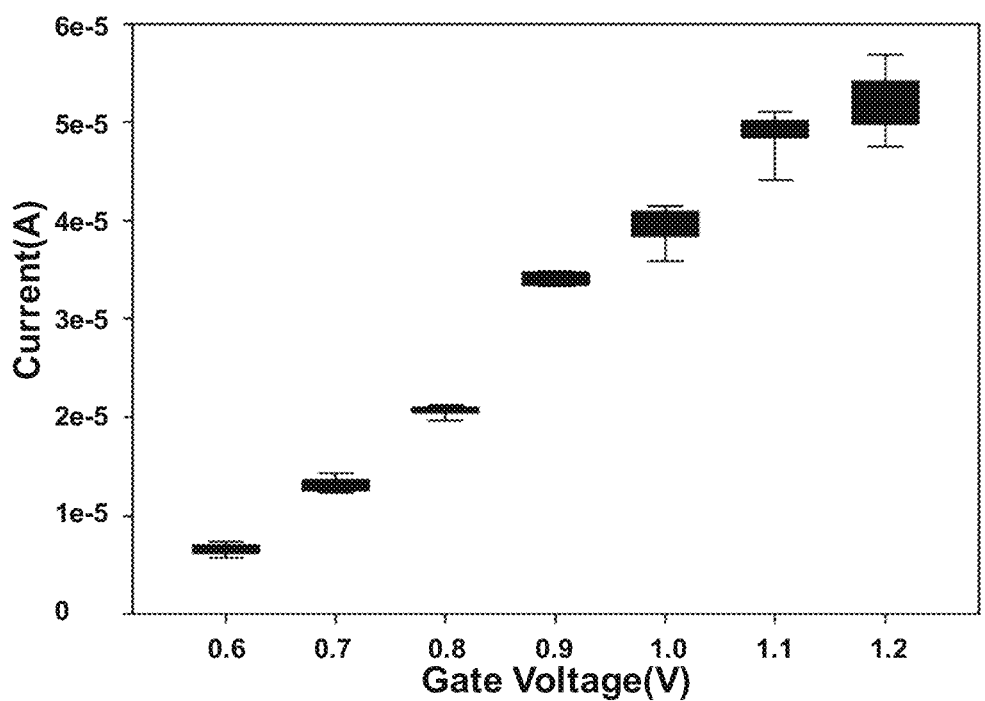
FIG. 4 is a statistical schematic diagram of the conductance distribution of a 1T1R memory according to the preferred embodiment of the present disclosure under different gate voltages and limiting currents.

FIG. 4 is a statistical schematic diagram of the conductance distribution of the 1T1R memory under different gate voltages and limiting currents according to the preferred embodiment of the present disclosure. Different conductance states of the RRAM can be obtained by different gate voltages, and the higher the gate voltage, the larger the conductance value (that is, different conductance values are obtained at different gate voltages and limiting currents. In FIG. 4, taking a read voltage $V_r$ of 0.2 V as an example, current values read at the read voltage $V_r$ of 0.2 V correspond to the conductance states, and as shown in FIG. 4, the higher the gate voltage, the higher the conductance value). The RRAM has different conductance states, and its lowest conductance value corresponds to the lowest current value. Taking FIG. 4 as an example, the lowest current value shown in FIG. 4 is the required detection current accuracy, which may be $10^{-6}$ A. In addition, a gate voltage applied during the max pooling operation can be in a range of 0.6 V to 1.2 V, and a gate voltage $V_d$ applied during the reading operation can be 1.8 V.

As shown in FIG. 5, the input module is configured to receive the result of each convolution operation, convert it into a voltage signal and input the voltage signal to the max pooling operation module. Specifically, the convolution result is normalized, and then converted into a voltage signal in proportion, that is, the larger the convolution result, the larger the voltage signal. Generally, there is more than one convolutional layer and pooling layer in a convolutional neural network, and thus, each pooling layer feature map is stored in each row of the 1T1R array. The peripheral control circuits are configured to control applied voltages in each operation, and a RRAM to be operated is selected by the applied voltages. When the pooling operation is completed and the pooling result needs to be read for the next calculation, a read voltage is applied by the peripheral control circuit to obtain an output current value, which is proportional to the pooling result. Then, the output module converts the current signal into a voltage signal in proportion for the next calculation.

Figure 6:
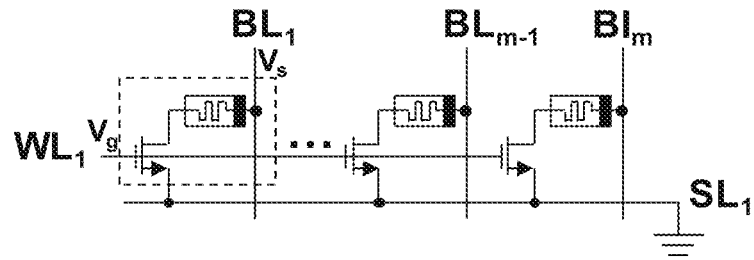
FIG. 6 is a schematic diagram showing a max pooling operation according to the preferred embodiment of the present disclosure.

FIG. 6 is a schematic diagram of a max pooling operation according to the preferred embodiment of the present disclosure. The dashed box represents the selected 1T1R memory for a pooling operation. During the pooling operation, a voltage $V_s$ is applied to the $BL_1$ terminal of the 1T1R memory, the other BL terminals are disconnected, the SL terminal is grounded, and a signal voltage $V_g$ is applied to the $WL_1$ terminal. In a pooling operation, different convolution results (i.e., a pulse sequence of voltages $V_g$) are input, and the RRAM may be operated to a conductance state corresponding to a voltage having the maximum amplitude in the pulse sequence. After completing the pooling operation, the next pooling operation is performed in a similar way, that is, a voltage $V_s$ is applied to the next BL terminal of the 1T1R memory, the other BL terminals are disconnected, so that the next RRAM is selected, and convolution results (i.e., a voltage pulse sequence) are input to the WL terminal for the next pooling operation. In the array, the pooling operation in each row can be performed at the same time. By selecting units in the same column each time for pooling operations and then selecting other column units for operation one by one, all pooling operation can be completed. In addition, the pooling layer feature map data can be stored in a way that the same pooling layer feature map data are stored in the same row.

Figure 7:
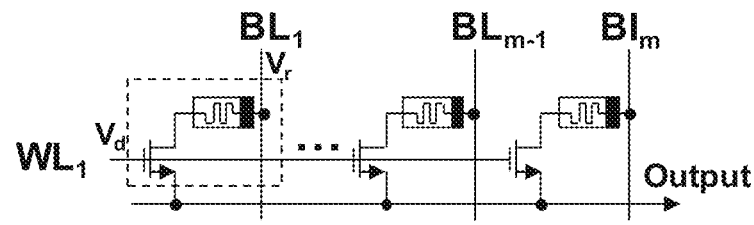
FIG. 7 is a schematic diagram showing an operation of reading a pooling result according to the preferred embodiment of the present disclosure.

FIG. 7 is a schematic diagram showing an operation of reading a pooling result according to the preferred embodiment of the present disclosure. The dashed box represents an RRAM that stores pooling feature map data. Different conductance states of each RRAM correspond to the size of the pooling layer feature map data results. When a read operation is performed, a read voltage $V_d$ is applied to the WL terminal, and a same read voltage $V_r$ is applied to all BL terminals in sequence. Due to different conductance values of the RRAM, corresponding output current values are different. The current value is proportional to the conductance value, i.e., being proportional to the result of the pooling layer feature map data. In this way, results of all pooling layer feature map data can be read in sequence. In the array, read operations can be performed on each row at the same time, and units in the same column can be selected in parallel for read operations. By selecting all the column units one by one for reading, all reading operations can be completed. The output currents can be further input to the output module and processed for calculation in the next layer.

FIGS. 3 to 7 only show an example in which the transistor is a NMOS transistor. The present disclosure can also adopt a PMOS transistor, in which case $V_s$ is negative, and the conductance value of the RRAM is still positive and is proportional to $|V_g|$.

It should be readily understood to those skilled in the art that the above description is only preferred embodiments of the present disclosure, and does not limit the scope of the present disclosure. Any change, equivalent substitution and modification made without departing from the spirit and scope of the present disclosure should be included within the scope of the protection of the present disclosure.

What is claimed is:

1. A max pooling processor based on 1T1R memory, wherein the max pooling processor is configured to perform a max pooling operation on a convolution result in a convolutional neural network by using the 1T1R memory formed by a transistor and a RRAM connected in series, and the max pooling processor comprises an input module, a max pooling operation module, and an output module, wherein the max pooling operation module is provided with the 1T1R memory;

the input module is connected to the max pooling operation module, and is configured to transmit an operating voltage to the max pooling operation module according to the convolution result in the convolutional neural network, the operating voltage being used as a gate voltage of the transistor in the 1T1R memory;

the 1T1R memory in the max pooling operation module is configured to adjust a conductance value of the RRAM according to the gate voltage of the transistor in the 1T1R memory to achieve the max pooling operation by using a non-volatile multi-value conductance regulation characteristic of the RRAM, and store a max pooling result; and the output module is connected to the max pooling operation module, and is configured to read the max pooling result stored in the max pooling operation module and output the max pooling result.

2. The max pooling processor based on 1T1R memory according to claim 1, wherein an amplitude of the operating voltage transmitted by the input module is proportional to a magnitude of the convolution result, and the highest amplitude of the operating voltage does not exceed a range of working voltage of a gate of the transistor; and the operating voltage is transmitted in a form of a voltage pulse, and the voltage pulse corresponds to a plurality of convolution results, wherein voltage amplitudes in different periods in the voltage pulse correspond to different convolution results.

3. The max pooling processor based on 1T1R memory according to claim 1, wherein the transistor in the 1T1R memory is a NMOS transistor, and in a case where two ends of the RRAM are respectively a bottom electrode and a top electrode, a drain of the transistor is connected to the bottom electrode of the RRAM;

when the max pooling processor based on 1T1R memory performs the max pooling operation, for the 1T1R memory, in addition to the gate voltage of the transistor being the operating voltage transmitted by the input module, a source of the transistor is grounded, and a constant preset voltage $V_s$ is applied to the top electrode of the RRAM;

when the max pooling processor based on 1T1R memory performs a reading operation, for the 1T1R memory, a constant preset voltage $V_d$ is applied to the gate voltage of the transistor, a constant preset voltage $V_r$ is applied to the top electrode of the RRAM, and the source of the transistor is configured to output a current carrying conductance value information of the RRAM to the output module, so that the max pooling result stored in the 1T1R memory is obtained according to the current.

4. The max pooling processor based on 1T1R memory according to claim 3, wherein the output module is configured to convert the current carrying conductance value information of the RRAM into a voltage signal in proportion and output the voltage signal, thereby obtaining the max pooling result stored in the 1T1R memory.

5. The max pooling processor based on 1T1R memory according to claim 1, wherein the 1T1R memory is plural, and the 1T1R memories are arranged in the max pooling operation module in a form of a two-dimensional 1T1R array;

among the 1T1R memories, the 1T1R memories in the same row, sources of transistors are connected to each other through a wire, and connected to a third peripheral control circuit; gates of the transistors are connected to each other through a wire, and connected to a first peripheral control circuit;

the 1T1R memories in the same column, top electrodes of RRAMs are connected to each other by a wire, and connected to a second peripheral control circuit;

when the max pooling processor performs the max pooling operation in batches by taking the 1T1R memories in the same column as a unit, the first peripheral control circuit is configured to input the operating voltage transmitted by the input module to the unit, the second peripheral control circuit is configured to input a constant preset voltage $V_s$ to the unit, and the third peripheral control circuit is configured to input a voltage of 0 to the unit, other 1T1R memories being disconnected with the first peripheral control circuit, the second peripheral control circuit and the third peripheral control circuit;

when the max pooling processor performs a reading operation in batches by taking the 1T1R memories in the same column as a unit, the first peripheral control circuit is configured to input a constant preset voltage $V_d$ to the unit, the second peripheral control circuit is configured to input a constant preset voltage $V_r$ to the unit, and the third peripheral control circuit is configured to output source currents of the respective 1T1R memories in the unit to the input module, other 1T1R memories being disconnected with the first peripheral control circuit, the second peripheral control circuit and the third peripheral control circuit.

6. The max pooling processor based on 1T1R memory according to claim 5, wherein each row in the two-dimensional 1T1R array corresponds to one pooling layer, and each pooling layer feature map data is stored in each row in the two-dimensional 1T1R array.

7. The max pooling processor based on 1T1R memory according to claim 3, wherein an absolute value of the voltage $V_r$ is 0.2V or less, and an absolute value of the voltage $V_d$ is 1.8V or more.

* * * * *